United States Patent
Ngo et al.

(10) Patent No.: US 7,023,046 B2
(45) Date of Patent: Apr. 4, 2006

(54) UNDOPED OXIDE LINER/BPSG FOR IMPROVED DATA RETENTION

(75) Inventors: Minh Van Ngo, Fremont, CA (US); Angela Hui, Fremont, CA (US); Ning Cheng, Cupertino, CA (US); Jeyong Park, Sunnyvale, CA (US); Jean Yee-Mei Yang, Sunnyvale, CA (US); Robert A. Huertas, Hollister, CA (US); Tazrien Kamal, San Jose, CA (US); Pei-Yuan Gao, San Jose, CA (US); Tyagamohan Gottipati, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 89 days.

(21) Appl. No.: 10/617,450

(22) Filed: Jul. 11, 2003

(65) Prior Publication Data

US 2005/0006693 A1    Jan. 13, 2005

(51) Int. Cl.
*H01L 29/788*   (2006.01)

(52) U.S. Cl. .................................... 257/315; 257/314
(58) Field of Classification Search ............... 257/295, 257/298, 314–325
See application file for complete search history.

(56) References Cited

U.S. PATENT DOCUMENTS

| | | | |
|---|---|---|---|
| 5,840,607 A * | 11/1998 | Yeh et al. .................... | 438/257 |
| 5,897,354 A * | 4/1999 | Kachelmeier ............... | 438/264 |
| 6,080,639 A * | 6/2000 | Huang et al. ............... | 438/435 |
| 2003/0003658 A1* | 1/2003 | Tseng et al. ................ | 438/257 |

* cited by examiner

*Primary Examiner*—David Nelms
*Assistant Examiner*—Long Tran

(57) ABSTRACT

Semiconductor devices with improved data retention are formed by depositing an undoped oxide liner on spaced apart transistors followed by in situ deposition of a BPSG layer. Embodiments include depositing an undoped silicon oxide liner derived from TEOS, as at a thickness of 400 Å to 600 Å, on transistors of a non-volatile semiconductor device, as by sub-atmospheric chemical vapor deposition, followed by depositing the BPSG layer in the same deposition chamber.

3 Claims, 1 Drawing Sheet

US 7,023,046 B2

UNDOPED OXIDE LINER/BPSG FOR IMPROVED DATA RETENTION

FIELD OF THE INVENTION

The present invention relates to a method of manufacturing semiconductor devices having high reliability and improved data retention. The present invention has particular applicability in manufacturing high density, multi-level flash memory devices with improved data retention and improved gap filling.

BACKGROUND ART

Various issues arise in attempting to satisfy the ever increasing demands for miniaturization, particularly in fabricating non-volatile semiconductor devices, such as flash memory devices, e.g., electrically erasable programmable read only memory (EEPROM) devices. The demands for continuing miniaturization have led to the fabrication of flash memory devices comprising transistors having a gate width of about 0.13 micron and under and gate structures spaced apart by a small gap of about 0.30 micron or less. In accordance with conventional practices, an oxide sidewall spacer is formed on side surfaces of the gate stack, thereby reducing the gap to about 0.125 micron, and a conformal silicon nitride layer deposited thereon. The first interlayer dielectric (ILD0) is then deposited over the gate structures filling the gaps therebetween. Rapid thermal annealing is then conducted, as at a temperature of about 820° C. for about 120 seconds.

As miniaturization proceeds apace, various reliability issues arise, particularly as EEPROM device dimensions are scaled into the deep sub-micron regime, such as data retention losses and the difficulty in filling the gaps without void formation. Charge losses (data retention) cause undesirable delays in production from increased manufacturing costs.

Accordingly, there exists a need for semiconductor devices, such as flash memory devices, e.g., EEPROMS, with improved reliability and increased operating speed, and for efficient enabling methodology. There exists a particular need for methodology enabling the fabrication of flash memory devices, such as EEPROM devices, with improved data retention and improved reliability.

DISCLOSURE OF THE INVENTION

An advantage of the present invention is a method of manufacturing flash memory semiconductor devices with improved data retention and improved reliability.

Another advantage of the present invention is a flash memory semiconductor device having improved data retention and improved reliability.

Additional advantages and other features of the present invention will be set forth in the description which follows and in part will be apparent to those having ordinary skill in the art upon examination of the following or may be learned from the practice of the present invention. The advantages of the present invention may be realized and obtained and particularly pointed out in the appended claims.

According to the present invention, the foregoing and other advantages are achieved in part by a method of manufacturing a semiconductor device, the method comprising: forming two gate electrode structures, spaced apart by a gap, on a semiconductor substrate; depositing an undoped oxide liner on the gate electrode structures and into the gap; and depositing a layer of boron (B) and phosphorous (P)-doped silicon oxide (BPSG) on the undoped oxide liner filling the gap.

Embodiments of the present invention include depositing an undoped silicon oxide liner derived from tetraethyl orthosilicate (TEOS) by sub-atmospheric-chemical vapor deposition (SA-CVD), as at a thickness of 400 Å to 600 Å, and thereafter depositing in-situ the BPSG layer by SA-CVD in the same deposition chamber under otherwise essentially the same deposition conditions by introducing triethylborate (TEB) and triethylphosophate (TEPO).

Another aspect of the present invention is a semiconductor device comprising: two gate electrode structures, spaced apart by a gap, on a semiconductor substrate; an undoped oxide liner on the gate electrode structures in the gap; and a layer of boron (B) and phosphorous (P)-doped silicon oxide (BPSG) on the undoped oxide liner filling the gap. Embodiments of the present invention include semiconductor devices with gate electrode structures comprising a tunnel oxide on the semiconductor substrate, a floating gate electrode on the tunnel oxide, an interpoly dielectric comprising an oxide/nitride/oxide (ONO) stack on the floating gate; and a control gate electrode on the interpoly dielectrode. Embodiments of the present invention further include gate electrode structures with silicon oxide sidewall spacers on side surfaces thereof.

Additional advantages of the present invention will become readily apparent to those skilled in this art from the following detailed description, wherein embodiments of the present invention are described simply by way of illustration of the best mode contemplated for carrying out the present invention. As will be realized, the present invention is capable of modifications in various obvious respects, all without departing from the present invention. Accordingly, the drawing and description are to be regarded as illustrative in nature, and not as restrictive.

DESCRIPTION OF THE INVENTION

Figure 1:
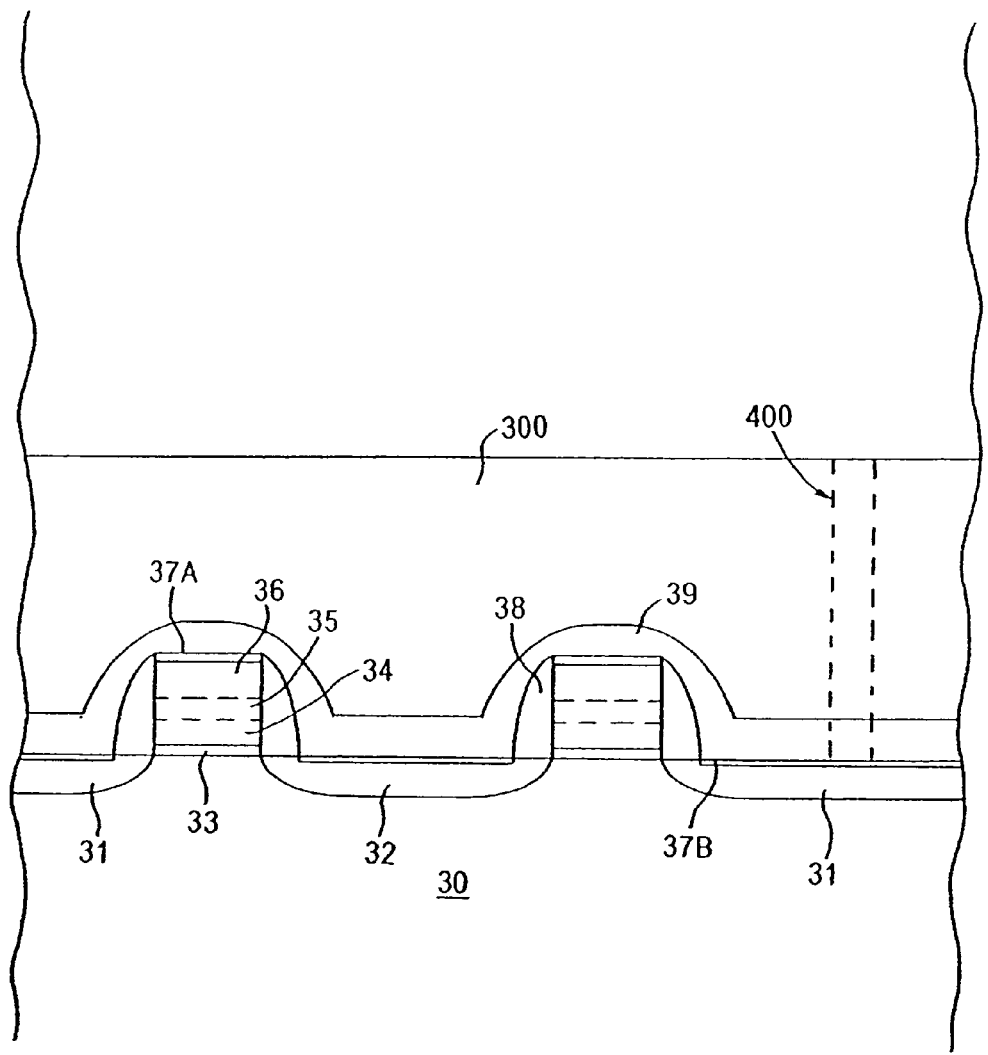
FIG. 1 schematically illustrates an embodiment of the present invention.

The present invention addresses and solves various reliability problems which arise in fabricating microminiaturized semiconductor devices, such as flash memory devices, e.g., data retention and gap filling. The present invention provides efficient methodology enabling the fabrication of semiconductor devices exhibiting greater reliability and improved data retention.

Upon conducting experimentation and investigation, it was postulated that mobile hydrogen ions in the conventional silicon nitride etch stop layer overlying the gate electrode structure degrade the ONO stack causing data retention issues. The present invention addressees and solves such data retention problems by strategically removing the conventional silicon nitride liner and replacing it with an undoped oxide liner prior to depositing the first interlayer dielectric (ILD$_0$).

It was found that the strategic use of an undoped silicon oxide liner in lieu of the conventional silicon nitride liner containing hydrogen, as by a SA-CVD at a thickness of 400 Å to 600 Å, e.g., 500 Å, resulted in a significant improvement in data retention, such as 300 to 400 mV.

In accordance with embodiments of the present invention, the undoped silicon oxide liner and subsequent ILD$_0$ are deposited in the same chamber, in-situ, under basically the same deposition conditions except that dopant sources are introduced during deposition of the ILDO, such as B and P sources when depositing BPSG. This technique advantageously results in superior gap filled properties and reduces defects because of the reduction in wafer handling. In addition, cycle time is improved, thereby increasing manufacturing throughput.

In accordance with embodiments of the present invention, the undoped silicon oxide liner may be deposited by SA-CVD at a TEOS flow rate of 400 to 600 mgm, e.g., 500 mgm, and ozone ($O_3$) flow rate of 3,600 to 4,400 sccm, e.g., 4,000 sccm, a helium (He) flow rate of 5,400 to 6,600 sccm, e.g., 6,000 sccm, a pressure of 180 to 220 Torr, e.g., 200 Torr, a temperature of 460° C. to 500° C., e.g., 480° C., and a spacing (distance between the wafer and shower head through which the gases exit) of 200 to 240 mils, e.g., 220 mils. Deposition of the undoped silicon oxide liner may be implemented for about 30 seconds to 38 seconds, e.g., 34 seconds, to deposit the undoped silicon liner at a thickness of 400 Å to 600 Å, e.g., 500 Å.

After deposition of the undoped silicon oxide liner, SA-CVD deposition is continued under basically the same conditions except that TEB is introduced at a flow rate of 123 to 183 mgm, e.g., 153 mgm, and TEPO is introduced at a flow rate of 31 to 71 mgm, e.g., 51 mgm, while continuing introduction of TEOS at a flow rate of 400 to 600 mgm, e.g., 500 mgm, $O_3$ at a flow rate of 3,600 to 4,400 sccm, e.g., 4,000 sccm, He at a flow rate of 5,400 to 6,600 sccm, e.g., 6,000 sccm, and maintaining the pressure at 180 to 220 Torr, e.g., 200 Torr, temperature at 460° C. to 500° C., e.g., 480° C., and spacing at 200 to 240 mils, e.g., 220 mils. Deposition of the BPSG layer may be conducted for a period of time sufficient to obtain a desired thickness, such as 123 seconds to 151 seconds, e.g., 134 seconds, to provide a BPSG layer thickness of 11,000 Å to 13,000 Å, e.g., 12,000 Å. Subsequently, rapid thermal annealing may be conducted as at a temperature 820° C. and for 120 seconds.

An embodiment of the present invention is schematically illustrated in FIG. 1 wherein transistors are formed on substrate 30. Substrate 30 may comprise doped monocrystalline silicon or a plurality of wells or epitxial layers. The transistors may comprise dual gate structures with an interpoly (ONO) dielectric therebetween. For example, transistors can comprise tunnel oxide 33, a floating gate electrode 34, an ONO stack interpoly dielectric 35, and a control gate 36. A layer of metal silicide 37A is formed on an upper surface of the gate electrode stack while a layer of metal silicide 37B is formed on the source/drain regions 31, 32. A dielectric sidewall spacer 38, such as silicon oxide, is formed on the side surfaces of the gate electrode. In accordance with the embodiments of the present invention, a conformal undoped silicon oxide layer 39, such as silicon oxide derived from TEOS by SA-CVD, is deposited over the gate structures into the gaps. In accordance with the present invention, BPSG layer 300 is then deposited in-situ, in the same deposition chamber using essentially the same deposition conditions employed for depositing undoped silicon oxide layer 39, followed by rapid thermal annealing. Subsequent processing includes forming contact holes 400, as by anisotropic etching.

In accordance with the present invention, a conventional silicon nitride liner is strategically replaced with an undoped silicon oxide liner deposited by SA-CVD followed in-situ deposition of a BPSG layer in the same deposition chamber, thereby improving data retention, improving gap filling, increasing manufacturing throughput and reducing defects caused by wafer handling. The present invention provides microminiaturized semiconductor devices, such as EEPROM devices, with improved reliability, increased operating speed, improved data retention and increased manufacturing throughput with an attendant reduction in manufacturing costs.

The present invention enjoys industrial applicability in manufacturing various types of semiconductor devices, particularly highly integrated semiconductor devices exhibiting increased circuit speed and sub-micron dimensions, e.g., with a design rule of about 0.12 micron and under, with high reliability. The present invention enjoys particular industrial applicability in manufacturing flash memory devices, such EEPROMs, with improved data retention, improved reliability, increased operating speed, reduced manufacturing costs and increased production throughput.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawing are, accordingly, to be regarded as illustrative and not restrictive. It is understood that the present invention is capable of using various other combinations and environments and is capable of changes or modifications within the scope of the inventive concept as expressed herein.

What is claimed is:

1. A semiconductor device comprising:
    two gate electrode structures, spaced apart by a gap, on a semiconductor substrate;
    silicon oxide spacers on side surfaces of the gate electrode;
    an undoped oxide liner on the silicon oxide spacers in the gap; and
    a layer of subatmospheric-chemical vapor deposited (SA-CVD) boron (B) and phosphorous (P)-doped silicon oxide (BPSG) on the undoped oxide liner filling the gap, wherein the gate structures comprise:
    a tunnel oxide on the semiconductor substrate;
    a floating gate electrode on the tunnel oxide;
    an interpoly dielectric comprising an oxide/nitride/oxide (ONO) stack on the floating gate; and
    a control gate on the interpoly dielectric.

2. The semiconductor device according claim 1, wherein the undoped oxide liner has a thickness of 400 Å to 600 Å.

3. The semiconductor device according to claim 1, where the undoped oxide liner comprises undoped silicon oxide derived from tetraethyl orthosilicate (TEOS).

* * * * *